United States Patent Office 3,293,093

Patented Dec. 20, 1966

3,293,093

DISSOLUTION OF METAL WITH ACIDIFIED HYDROGEN PEROXIDE AND USE AS COPPER ETCHANT IN MANUFACTURE OF PRINTED CIRCUITS

Harold F. Jones, Marcellus, Carmelo L. Alderuccio, Camillus, John G. Poor, Otisco, and Lawrence P. Gould, Syracuse, N.Y., assignors to Allied Chemical Corporation, New York, N.Y., a corporation of New York No Drawing. Filed Dec. 30, 1963, Ser. No. 334,572
18 Claims. (Cl. 156—18)

This invention relates to the treatment of metal with hydrogen peroxide, and more particularly to acid-hydrogen peroxide solutions as an etchant for copper as in the manufacture of printed circuits.

Dissolution by etching or chemical milling of various metals is a well-known art having a broad range of applications. A specific area of application involves the etching of copper metal in the manufacture of printed circuit boards for the electronics industry. Briefly outlined, the manufacture of printed circuits involves a laminate of copper and a sheet of electrically resistant material which is usually a plastic. The exposed copper surface of the copper-plastic laminate is covered with a chemically resistant protective material, such as a plastic masking material or solder, applied in such a way that it conforms to the pattern of the conductive circuits desired in the board. The remaining exposed copper surfaces are then removed from the board to form the desired conductive pattern by subjecting to the action of a chemical milling agent such as a copper etchant which reactively attacks the copper. The copper to be removed is dissolved away by the etchant exposing the underlying plastic base which separates the elements of the then formed conductive pattern on the board.

Etching for a constructive purpose as in the manufacture of printed circuits is not a simple matter and involves several considerations if it is to be a practical success. Among the more important considerations are rate of attack of the etchant, control of the etchant, stability and efficiency of the etchant, time and temperature conditions, effect of the etchant on the materials forming the printed circuit board, and effect on the equipment and masking material employed in the etching process. Printed circuit etching has been carried out with an aqueous ferric chloride solution which has been satisfactory at least in its ability to efficiently etch copper without material adverse side effects. However, in more recent times, the disposition of the spent ferric chloride etchant solution containing both iron and copper has become a problem, largely because of the disposal of the waste liquor and difficulty in recovering copper therefrom which is of course desirable from a cost standpoint. Other copper etchants have therefore been sought with the result that aqueous solutions of ammonium persulfate have been adopted by some users. This etchant permits electrolytic recovery of copper from the spent etchant solution and eliminates the problem of disposing of metal containing waste liquors. However, ammonium persulfate as an etchant is a premium material because of its low etching capacity and is subject to other drawbacks which have left considerable room for improvement in the provision of an etchant for copper.

As an etchant for copper, aqueous hydrogen peroxide would be very attractive because of its relatively low cost and ability to recover copper electrolytically from a spent peroxide etchant solution. However, the utilization of hydrogen peroxide for a constructive purpose in metal etching is subject to numerous problems and pitfalls. Metals which are attacked by hydrogen perxoide are depreciated at unpredictable rates and attack is often incomplete, the reasons for which are not often ascertainable. An additional problem in the use of hydrogen peroxide generally is stability of the compound which may vary considerably depending upon the environment in which it is placed. In the presence of many metals hydrogen peroxide is known to be more or less unstable even though provision has been made to prevent or arrest decomposition of the compound. Copper metal is particularly troublesome in this respect. In metal etching this becomes a problem of major importance and particularly with copper because of the formation of active metal ions which have been found to have such a highly depreciating effect on hydrogen peroxide that it is rapidly exhausted from solutions in which it is contained. In order to be practical a chemical etchant must have capacity to etch a relatively large amount of metal before the etch rate is slowed to an impractical level by the effective exhaustion of the etchant. Each increment in the amount of metal etched represents a significant increase in efficiency and a substantial reduction in the cost per weight unit of metal etched. In our experimentation we proposed to provide an etchant based on hydrogen peroxide by adding to solutions thereof a material which would either arrest the depreciating influence of large amounts of the dissolved metal ions or have a catalytic or similar accelerating effect upon etch rate in the presence of the etched metal. During our work we tried a multitude of materials for this purpose but found that many did not benefit the etch rate while several others even had the opposite effect.

An object of the present invention is to provide a new and improved etchant based on hydrogen peroxide.

Another object of the invention is to provide a new and improved method for etching copper metal.

Another object is to provide a highly efficient hydrogen peroxide etchant capable of dissolving large amounts of metal before effective exhaustion slows the etch rate to an impractical level.

A further object is to provide a practical, efficient method for etching copper for a constructive purpose as in the manufacture of printed circuits.

A still further object is to provide a hydrogen peroxide etchant adapted for efficient practical use in various conventional etching apparatus and procedures including both immersion and spray etching operations.

Other objects and avantages will be evident from the following description of the invention.

In accordance with the invention it has been found that the addition to certain acid-hydrogen peroxide solutions of a small amount of phenacetin, sulfathiazole, or silver ion, preferably a mixture of phenacetin with sulfathiazole or silver ions, results in the provision of compositions by which metal may be dissolved for constructive purposes in a practical and most efficient manner. Etching is accomplished in the more preferred embodiments of the invention by contacting the metal work with an aqueous solution containing between about 2–12% by weight hydrogen peroxide, preferably 2–10% hydrogen peroxide, from about 0.45 to about 5.5 grams per liter hydrogen ion, preferably between about 0.65–4.50 grams per liter, and having incorporated therein a catalytic amount of additive selected from the group consisting of phenacetin, sulfathiazole, silver ions, and mixtures thereof. Solution temperatures during etching are regulated within the range of about 40–65° C., preferably between about 50–62° C. The present invention involving the dissolution of metal with acidified hydrogen peroxide containing phenacetin or sulfathiazole has several outstanding features including: (1) the provision of a method for etching in a practical manner at high rates significantly greater than those realized with ammonium persulfate; (2) the provision of a hydrogen peroxide etchant having high etching capacity of at least about 8–10 ounces of copper per gallon; (3) the provision of an etchant capable of exhibiting fast etch rates at the higher dissolved copper concentrations; (4) the provision of a high capacity hydrogen peroxide etchant capable of efficient use in both immersion and spray etching procedures; (5) waste liquors from the treatment of copper by the invention may be readily treated electrolytically to remove and recover dissolved copper; and (6) the method of the invention permits accurate, controlled and highly efficient etching of copper clad laminates and is eminently suited for use in the manufacture of printed circuit boards.

Phenaceton, sulfathiazole and silver ion are all highly effective in improving the etch rate and capacity of acid-peroxide solution. Salts yielding these additives in the acid-peroxide solution may also be employed. For example, the sodium salt of sulfathiazole may be added to the solution. Silver nitrate and other soluble salts such as silver sulfate will furnish silver ions. The preferred catalytic additives are phenacetin and silver ion with best results obtained when phenacetin is employed in combination or admixture with sulfathiazole or silver ion. When phenacetin is used alone it is important that the aqueous hydrogen peroxide etchant solution contain less than 2 parts per million total free chloride and bromide ions, preferably less than 1 part per million. It therefore becomes necessary to give special consideration in preparing the etchant solutions which are to contain only phenacetin as additive. For example, deionized water may be used to make-up an etchant containing less than 2 parts per million of chloride and bromide ions. Or, if desired, ordinary water may be employed in make-up of the etchant solution if accompanied by addition of suitable material capable of removing free chloride and bromide ions. In a preferred embodiment of the invention a small amount of a water-soluble silver salt, preferably silver nitrate, is added to effect the removal of chloride and bromide ion. The precipitated silver halide matter is allowed to remain in the acid-peroxide-phenacetin solution and does not interfere with the etching process. The addition of excess soluble silver salt will furnish free silver ions in the etchant and have a highly beneficial and catalytic effect upon etch rate and capacity. Solutions having incorporated herein both phenacetin and free silver ion are the more preferred and exhibit exceptionally fast etch rates and high capacity significantly greater than obtained when either additive is used alone. As a general rule special consideration is given to provide a hydrogen peroxide etchant solution in which little or no chloride and bromide ion is present. However, when sulfathiazole is employed in the etchant it has been found that special consideration may be dispensed with. While the explanation for this result is uncertain it is evident that sulfathiazole functions not only to increase the etching capacity of peroxide solutions but also to negate the adverse repressive effect of the chloride and bromide ion concentration on etch rate and capacity. Hence, in most cases the addition of sulfathiazole has the advantage of permitting use of ordinary tap water in preparation of the etchant without special treatment as required when phenacetin is used alone. When employing sulfathiazole either in combination or alone in etchants prepared from ordinary tap water between about 150 to 250 parts per million are usually required to negate the adverse effects of the free chloride and bromide ions in the water. The capacity of sulfathiazole in overcoming the adverse effect of chloride and bromide ion is apparently not unlimited. Solutions containing the higher concentrations of these ions, say above about 30 parts per million, will require additional treatment to negate this effect of such ions, e.g., deionization or addition of a soluble silver salt. On adding both phenacetin and sulfathiazole to the acid-peroxide solutions it was also found that not only did etch rate and capacity improve but that the improvement was discernably greater than when either additive was employed alone. Exceptionally good results are also obtained when all three additives are added to the acidified-peroxide solution.

In preparation of the acidified peroxide etchant only a small amount of additive is required to have the desired catalytic effect. As little as about 50 parts per million of phenacetin or sulfathiazole may be used in providing an etchant of improved capacity. Somewhat lesser amounts of free silver ion may be effective, particularly in immersion etching procedures where as little as about 10 parts per million would be effective. Increasing the amount of additive will further increase etch rate. About 200–1,000 parts per million of phenacetin or sulfathiazole is preferred. About 50–500 parts per million of free silver ion generally represents a preferred amount. The upper limit of the amount of additive is not critical and mostly a matter of economics. Generally, an amount of additive in excess of about 5,000 parts per million offers no added advantage and is undesirable from a process and economic standpoint. When using mixtures of phenacetin, sulfathiazole or a material furnishing silver ions at least about 25 parts per million of each are employed. Preferably the mixtures total about 200–1,500 parts per million of additive with between about 100–1,000 parts per million of each being employed. A particularly preferred solution has incorporated therein between about 300 to 500 parts per million phenacetin and about 100 to 300 parts per million free silver ion. Another preferred solution contains between about 300 to 500 parts per million phenacetin and about 250 to 450 parts per million sulfathiazole.

In the dissolution of metal by the invention the hydrogen peroxide concentration may vary over a fairly wide range. Etching of copper metal is desirably carried out in acidified solutions having a hydrogen peroxide concentration between about 2–12%. At solution concentrations less than about 2% by weight etch rates are impractically low and etching unsatisfactory. At concentrations about above 12% by weight it has been found that copper metal may be etched but the dissolution of the etched copper ions in the etchant causes decomposition of the peroxide with the result that etching at such high concentrations is less economical. The best results are obtained in solutions having a peroxide concentration between about 2–10%. During the etching process hydrogen peroxide is consumed as more and more amounts of copper are treated. In order to be practical it is necessary that a single etchant dissolve a substantial amount of copper metal before the solution becomes exhausted to the extent that particular workpiece can be etched within a reasonable time, e.g. 1–2 hours. The hydrogen peroxide solutions employed in the invention must therefore have an initial hydrogen peroxide concentration of at least about 4% in order to dissolve sufficient metal to be practical from an economic standpoint. Desirably, the etchant solution has initially a hydrogen peroxide concentration within the range of about 5–10% by weight. The hydrogen peroxide solutions having the indicated initial hydrogen peroxide concentrations are useful in etching a single large copper piece or a series of workpieces containing limited amounts of copper. The etchant is capable of operating effectively at good etch rates after partial exhaustion and at high dissolved copper concentrations equivalent to at least 10 ounces of copper per gallon and even substantially higher.

The acid concentration may also vary considerably. In copper etching it is desirable that the etchant solution have a hydrogen ion concentration from about 0.45 to about 5.5 grams per liter, preferably between about 0.65–4.5 grams per liter. Below a hydrogen ion concentration of about 0.45 grams per liter the etch rate is slow and peroxide decomposition high, particularly after partial exhaustion of the peroxide bath. The desired upper limit of the hydrogen ion concentration may depend on several factors including the particular acid employed. A hydrogen ion concentration above about 5.5 grams per liter is generally less economical and tends to slow down rather than increase the etch rate. Inorganic acids and even the stronger organic acids such as acetic acid may be used to supply the hydrogen ion concentration in the etchant solution. Examples of the acids which are the more suitable include sulfuric acid, nitric acid, and fluoboric acid, preferably sulfuric acid. Nitric acid has been surprisingly found to be useful in etching copper without release of any substantial amounts of toxic nitrogen oxide vapors which would normally be expected in such a process. The use of any significant amount of hydrochloric or hydrobromic acid is of course desirably avoided because of the introduction of large amounts of chloride and bromide ions which have a retarding effect on etching and must be negated, removed, or otherwise provided for in order to obtain a practical etching. The acid preferably employed in peroxide etching of copper is sulfuric acid. The amount of sulfuric acid in the hydrogen peroxide etchant is between about 2–23% by weight, preferably between about 3–20% by weight. Sulfuric acid concentrations above about 23% are less desirable as tendency to result in less uniform etching. This effect is apparently caused by the formation of a protective coating on substantial portions of the exposed copper surface which is thereby made resistant to etching. The influence of the acid concentration on the copper etch rate has been found interesting and worthy of note. When the acidified hydrogen peroxide etchant solution contains only minor amounts of dissolved copper the effect of acid concentration on etch rate is negligible and the full range of hydrogen ion concentrations between about 0.45 to 5.5 grams per liter results in little variance in etch rate. As the peroxide bath becomes more exhausted and dissolved copper concentration increases, the influence of the acid concentration increases markedly. At the higher dissolved copper concentrations both the lower and higher acid concentrations result in longer etch times. An optimum etch rate has been found to be reached at an intermediate hydrogen ion concentration between about 0.9 to 1.4 grams per liter (about 4–6% by weight sulfuric acid). In the etching of copper with the acid-hydrogen peroxide system of the invention both the hydrogen peroxide and acid are theoretically consumed at a rate equivalent to a mol ratio of hydrogen peroxide. Thus, according to the etching reaction one mol of sulfuric acid is consumed for each mol of peroxide and the acid concentration slowly decreases as the dissolved copper concentration increases. As the acid concentration does not have a substantial effect on etch rate at low dissolved copper concentrations it will be noted that the hydrogen peroxide etchant may contain initially a high hydrogen ion concentration with relatively little sacrifice of etch rate after partial exhaustion and increase of the dissolved copper concentration. In situations where it is desired to optimize etch rates and employ lower acid concentrations the etchant solution may be advantageously made up to contain initially a low or intermediate hydrogen ion concentration, of the order of about 0.45–3.4 grams per liter (about 2–15% by weight sulfuric acid), preferably between about 1.1–2.6 grams per liter (about 5–12% by weight sulfuric acid). Then, as the etchant is consumed causing reduction of the hydrogen ion concentration additional acid is added to regulate the hydrogen ion concentration within the optimum range of about 0.9–1.4 grams per liter (about 4–6% by weight sulfuric acid). Addition of the acid may take place either continuously or intermittently and either immediately after the start of the etching or after significant exhaustion of the etchant solution. When the initial hydrogen ion concentration is low, say of the order of about 0.45–1.1 grams per liter and 2–5% by weight sulfuric acid), the addition of the acid preferably takes place substantially immediately after etching commences and is desirably more or less continuous until the hydrogen ion concentration is increased to well within the range of about 0.9–1.4 grams per liter. When the initial hydrogen ion concentration is greater than about 1.1 grams per liter the addition of acid to maintain the optimum concentration preferably takes place from time to time and after the etchant solution has been exhausted to the extent that the hydrogen ion concentration is below about 1.1 grams per liter, usually just after the concentration is reduced below about 0.9 gram per liter.

In the etchant solution the ratio of hydrogen peroxide to acid is less important than the concentration of the acid. As the chemical reaction or mechanism by which copper is etched consumes one mol of peroxide and 2 mols of acid hydrogen a mol ratio of 1 to 2 is indicated, i.e. a $H_2O_2/H^+$ ratio of 1 to 2. Peroxide to hydrogen ion mol ratios less than 1 to 2 are therefore generally unnecessary and may tend to slow the etch rate, particularly at the higher reagent concentrations. In practice, the amount of hydrogen peroxide actually consumed seldom will exceed about 75% so that the inclusion of just slightly more than about 1.5 mols of hydrogen ion per mol of peroxide will be adequate to supply sufficient acid for complete utilization of the particular etchant solution. As some peroxide is also not utilized because of decomposition the etchants made up to include sufficient acid for complete utilization without addition of more acid preferably have a hydrogen peroxide to hydrogen in mol ratio of not less than about 1.0 to 1.6, and desirably in the range of about 1.0:1.6 to 1.0 to 1.0. When acid is to be later added and the etchant solution contains initially a low or intermediate acid concentration the mol ratio of peroxide to acid hydrogen may of course be initially somewhat greater, preferably between about 1.0:0.2 to 1.0:1.0. As hydrogen peroxide is consumed and more acid added the mol ratio of peroxide to acid will be reduced and eventually become similar to the mol ratios preferably employed in the solutions made up to contain the complete acid requirement. Again, because peroxide utilization seldom exceeds 75%, it is desirable from a practical viewpoint not to add an amount of acid sufficient to reduce the mol ratio of peroxide to acid hydrogen below about 1.0 to 1.6.

Temperature of the acidified-hydrogen peroxide solution is another important factor in etching copper. As a practical matter copper metal is not etched at room temperatures or below. The nature of the attack of the acid hydrogen peroxide solution on copper at such temperatures is more of a polishing, oxidizing or brightening effect. In order to efficiently etch copper the hydrogen peroxide solution must have a temperature of at least about 40° C. at time of contact with the metal. Solution temperature has a strong effect on etch rates and increasing the temperature to a preferred range between about 50–62° C. will substantially increase the rate of etching to a level significantly greater than heretofore realized with ammonium persulfate etchants at recommended optimum temperatures. At hydrogen peroxide solution temperatures above about 65° C. little further increase in etch rate is realized and such temperatures have been found particularly undesirable as resulting in an impractically high rate of peroxide decomposition. As is the case with acid concentration the influence of temperature on etch rate has been found to be greatest after partial exhaustion of the etchant and increase of the dissolved copper concentration. If desired, etching may be commenced at the lower temperatures, for example, between about 40° C. to 55° C., and temperature of the solution then gradually increased up to a higher temperature of approximately 55–62° C. as the solution is further exhausted. Increasing the temperature of the etchant solution is aided by the etching reaction itself which is moderately exothermic. Increasing the temperature of the etchant may be used to advantage to regulate etch rates at a more or less constant value when a number of pieces are to be etched in the same solution such as, for example, when employing automatic systems used in the manufacture of printed circuits.

Generally, the etchant compositions of the invention may be prepared by single mixing of the required components. The preferred etchants containing phenacetin may be readily prepared from an aqueous hydrogen peroxide concentrate containing between about 20–70%, preferably between 30–60%, by weight hydrogen peroxide and between about 400–15,000 parts per million phenacetin, preferably between 1,000–5,000 parts per million phenacetin. The more preferred hydrogen peroxide concentrates will also contain silver ions in an amount between about 200–5,000 parts per million, desirably between about 500–2,500 parts per million silver ions. The silver ions are preferably furnished by addition of silver nitrate in an amount between about 300–7,000 parts per million, more usually between 750–3,500 parts per million. The etchant solutions are readily prepared from the concentrate by addition of acid and water and, optionally, any other desired additive such as sulfathiazole. The hydrogen peroxide concentrate may be easily and safely shipped and has the further advantage of being storable for extended periods of time at room temperatures and above without depreciation.

A particular feature of the invention is that it may be utilized in that phase of the manufacture of printed circuit boards involving the etching of copper clad laminates to obtain the conductive pattern. Such etching is well-known and need not be described herein in great detail. The laminates from which the circuit boards are produced are usually composed of a thin copper sheet laminated to a base sheet of electrically insulating material which is typically a polymeric vinyl chloride plastic. Other electrically insulating materials to which the copper may be luminated include ceramics, glass, and the phenolic, epoxy, melamine, silicone and fluorocarbon resins. Thickness of the copper sheet in such laminates may vary considerably, say from about ¼ mil up to about 10 mils or more, usually between about ½ mil to 5 mils. It is conventional to gauge the thickness and amount of copper in such laminates in terms of ounces of copper per square foot. For example, a laminate having a copper sheet of about 2.7 mils thickness is commonly designated as a 2 ounce copperboard. The conductive pattern desired on the board is outlined by a masking or resist material which of course must be highly resistant to attack by the chemical agents employed in the etching step. Several types of resist materials are well-known and available commercially. Among such conventional materials found most suited for use with the peroxide etchant of the invention are Advance Plating Resist R–918–43 supplied by Advance Process Supply Company, Meaker Etch No. 200 supplied by Meaker Company, Sel-Rex Corporation, Candoc ss 1105, Toluidine Red supplied by Cudner & O'Connor Company, Candoc ss 1139, Perma Peacock Blue supplied by Cudner & O'Connor Company, KP Acid Resist No. 250–15 supplied by Kresslik Products Company, Economy White A 11632 supplied by Union Ink Company, Printed Circuit Resist Black supplied by Union Ink Company, and Kodak Photo Resist supplied by Eastman Kodak Company. A particular feature of the invention is that it is suitable for both immersion and spray etching. Agitation of the bath or workpiece is desirable as conventional in immersion etching procedures. In immersion etching a bath containing initially about 8% by weight hydrogen peroxide is preferred as a practical matter in obtaining the lower cost per weight unit of copper etched. In spray etching a solution containing initially about 6% by weight hydrogen peroxide is preferred. The peroxide solutions prepared from ordinary water to which a soluble silver salt has been added to remove chloride and bromide ion may of course be employed in both immersion and spray etching. In spray etching procedures the etchant should include either phenacetin or sulfathiazole, preferably phenacetin in combination with a material furnishing silver ions. The amount of silver ion required to realize optimum results is apparently somewhat greater in spray etching. The amount of silver ion added to spray etching solutions therefore is preferably between at least about 75 up to about 500 parts per million, desirably in the range of about 100–300 parts per million In practice, etch contact time of the workpiece with the etchant depends on several factors including particularly thickness or amount of copper to be etched, concentration or extent of exhaustion of the peroxide and acid in the bath, temperature, degree and method of agitation. A thin copper sheet may be etched at the higher permissible temperatures in a freshly made solution of high peroxide concentration in as little as about ¼ minute. Etching of successive boards requires longer times although a number of copper laminates of conventional copper weight may be etched with the peroxide solution over a fairly constant time period which is also a desirable feature. The longer contact times are mostly a matter of economics and capability of the highly exhausted bath to complete the etching within a reasonable period. Contact for about 60 minutes generally represents the practical upper limit for the hydrogen peroxide etchant of the invention. Contact times between about ½ to 50 minutes are preferably employed in etching a series of copper laminates of ½ to 5 mil thickness in the manufacture of printed circuits. Etch rates in manufacture of printed circuits may of course also be controlled by regulation of bath temperature and acid concentration as found possible with the peroxide etchant of the invention. Thus, the peroxide solution temperature may be slowly increased to provide a more constant etch time in treating a series of copper laminates. Acid concentration may be minimized and etch rates maximized by employing a solution having initially a low or intermediate acid concentration and, after partial exhaustion, adding more acid to regulate the hydrogen ion concentration within the optimum range of about 0.9–1.4 grams per liter. In the etching of printed circuit boards an important consideration is undercut which measures the degree to which the etchant acts horizontally beneath the resist material compared to the desired action vertically toward the underlying plastic base. Undercut is generally defined as a ratio of copper sheet thickness to the amount of horizontal attack under the resist material. A ratio better than 1 to 1 is desired for satisfactory results. The hydrogen peroxide etchant of the invention has been found highly satisfactory in this respect in demonstrating an undercut ratio of about 2.

The following examples in which parts and percentages are by weight unless otherwise noted demonstrate the practice and advantages of the present invention.

The copper clad laminates employed in the following examples were supplied by General Electric Company under Trademark "Textolite" (No. 11571). In Examples 1–12 the copper laminates were cut into board specimens having dimensions of 2¼ x 4½ x 1/16 inch. Each specimen had about 0.14 total ounce of 2.7 mil thick copper (2 ounces per square foot) laminated to a plastic base. In Examples 1–12 etching was carried out by immersion of the specimens in 500 gram solutions contained in 500 ml. tall beakers with a water bath used for control of the etchant bath temperature. Etching of the specimens having 0.14 ounce of copper in 500 grams of solution may be reported in terms of etch time at known ounces of copper dissolved per gallon of etchant in which terms the results in the examples are expressed. The specimen to be etched was attached at one of its ends to a reciprocating mechanism adapted to agitate the specimen up and down through a displacement distance of about ½ inch at a rate of about 50–60 strokes per minute. The 500 ml. beakers were charged with 500 grams of acidified hydrogen peroxide solution and etching commenced by introducing the specimen into the resulting peroxide bath while commencing agitation of the specimen. Etch time was determined with a stopwatch and etch rate calculated by weighing the specimen before immersion and after withdrawal from the bath. Etch time is expressed in terms of the time in minutes required to remove all of the exposed copper from the test specimen.

EXAMPLES 1–8

Employing the immersion procedure outlined above eight different etchant solutions were evaluated in etching a series of the copper clad specimens in each solution. The first six of the solutions tested (Baths A–F) each contained 8% by weight hydrogen peroxide and 23% by weight sulfuric acid such that the mol ratio of peroxide to acid was about 1 to 1, except for Baths E and F which contained 17.3% sulfuric acid such that the mol ratio of peroxide to acid was about 1 to 0.75. The peroxide etchants were prepared with deionized water and contained only about 0.2 part per million total free chloride and bromide ions. Bath A contained no additive. Bath B contained 400 parts per million phenacetin while Bath C contained 400 parts per million sulfathiazole. Bath D contained both phenacetin and sulfathiazole each in an amount of 200 parts per million. To Bath E there was added about 267 parts per million silver nitrate. Bath F included 400 parts per million phenacetin and 267 parts per million silver nitrate. The hydrogen peroxide etchant baths were regulated at a temperature of about 60° C. Baths G and H are ammonium persulfate solutions. Bath H, a 20% ammonium persulfate solution with mercuric chloride catalyst, was regulated at a temperature of 60° C. Results summarizing Examples 1–8 are given in Table 1.

while the peroxide Baths B, C and D containing additives show an improved and substantially faster etch rate at the higher copper concentrations indicating the effectiveness of the additives in increasing the efficiency of the peroxide etchant. The etch rates for the peroxide Baths B and C containing respectively phenacetin and sulfathiazole are almost twice as fast at 10 ounces of dissolved copper as the etch rate of the Bath A containing no additive. Bath D containing both phenacetin and sulfathiazole shows a further improvement in etch rate at the higher copper concentrations over the Baths B and C containing only one of these additives. The etch rate for Bath D is almost 2½ times the etch rate for Bath A at 10 ounces of dissolved copper. Results from the etching of a series of copper specimens in Bath E indicated that the addition of silver nitrate to the peroxide bath has an accelerating effect on etch rate. The addition of both phenacetin and silver nitrate to the peroxide etchant results in faster etch rates, particularly at the higher copper concentrations as shown by results obtained with Bath F. Examination of the residual peroxide Bath A after etching 10.2 ounces of copper showed a peroxide utilization of 42% with 32% of the original peroxide remaining in the bath and about 26% lost due to peroxide decomposition. Examination of the residual peroxide Bath B containing phenacetin after etching 11.3 ounces of copper showed a peroxide utilization of 46% with 25% of the original peroxide remaining in the bath and about 29% lost due to peroxide decomposition. Examination of the residual peroxide Bath C containing sulfathiazole after etching 11.6 ounces of copper showed a peroxide utilization of 46% with 32% of the original peroxide remaining in the bath and about 22% lost due to peroxide decomposition. Examination of the residual peroxide Bath D containing phenacetin and sulfathiazole after etching 12.7 ounces of copper showed a peroxide utilization of 52% with 29% of the original peroxide remaining in the bath and about 19% lost due to peroxide decomposition. Examination of the residual peroxide Bath E containing silver nitrate after etching 12.2 ounces of copper showed a peroxide utilization of 51% with 9% of the original peroxide remaining in the bath and about 40% lost due to peroxide decomposition. Examination of the residual peroxide Bath F containing silver nitrate and phenacetin after etching 14.2 ounces of copper showed a peroxide utilization of 60% with 14% of the original

*Table 1*

| Concentration | Etch Rate of Bath, Minutes | | | | | | | |
|---|---|---|---|---|---|---|---|---|
| | Bath A | Bath B | Bath C | Bath D | Bath E | Bath F | Bath G | Bath H |
| | Acid Peroxide, No Additive | Acid Peroxide, 400 p.p.m. Phenacetin | Acid Peroxide, 400 p.p.m. Sulfathiazole | Acid Peroxide, 200 p.p.m. Phenacetin, 200 p.p.m. Sulfathiazole | Acid Peroxide, 267 p.p.m. Silver Nitrate | Acid Peroxide, 267 p.p.m. Silver Nitrate, 400 p.p.m. Phenacetin | 20% Ammonium Persulfate 50° C. | 20% Ammonium Persulfate 60° C. |
| Ounces Copper Dissolved Per Gallon of Etchant: | | | | | | | | |
| Initial Rate | 1.5 | 2.8 | 2.5 | 2.0 | 1.0 | 1.0 | 7.5 | 24 |
| 2 Ounces | 2.1 | 3.7 | 4.5 | 3.0 | 1.0 | 1.6 | 10.0 | 28 |
| 4 Ounces | 3.5 | 5.8 | 7.0 | 3.8 | 1.7 | 2.3 | 14.0 | 45 |
| 6 Ounces | 6.5 | 8.5 | 9.8 | 6.5 | 2.9 | 3.0 | 20.0 | ------ |
| 8 Ounces | 14.0 | 12.0 | 13.8 | 10.0 | 5.5 | 4.0 | 34.0 | ------ |
| 10 Ounces | 40.0 | 23.5 | 26.8 | 16.9 | 15.0 | 5.5 | ------ | ------ |
| 11 Ounces | ------ | ------ | 37.5 | 23.0 | ------ | 6.2 | ------ | ------ |

Table 1 shows the etch rate for the acid-hydrogen peroxide etchant generally to be very high and clearly superior to the rate reported in the literature for commercial 20% ammonium persulfate Bath G at recommended concentration and temperature of 50° C. The hydrogen peroxide Bath A containing no additive shows a somewhat faster etch rate at the low dissolved copper concentrations peroxide remaining in the bath and about 26% lost due to peroxide decomposition.

EXAMPLES 9–12

Four additional peroxide Baths I–L were prepared similar to those in Examples 1–8 except that ordinary tap water was employed. Each bath contained about 8% hydrogen peroxide and 17.3% sulfuric acid. Bath I contained no additive and at least about 5 parts per million total free chloride and bromide ion. Bath J contained about 400 parts per million phenacetin. Bath K contained about 400 parts per million phenacetin in combination with 250 parts per million sulfathiazole. Both L was prepared of 400 parts per million phenacetin and 267 parts per million silver nitrate. Each bath was regulated during etching at a temperature of about 60° C. Results summarizing Examples 9–12 are given in Table 2.

*Table 2*

| Concentration | Etch Rate, Minutes | | | |
|---|---|---|---|---|
| | Bath I | Bath J | Bath K | Bath L |
| | Peroxide, No Additive | Peroxide, 400 p.p.m. Phenacetin | Peroxide, 400 p.p.m. Phenacetin, 250 p.p.m. Sulfathiazole | Peroxide, 400 p.p.m. Phenacetin, 267 p.p.m. Silver Nitrate |
| Ounces Copper Dissolved Per Gallon of Etchant: | | | | |
| Initial Rate | 7.0 | 6.5 | 1.5 | 1.0 |
| 2 Ounces | 7.1 | 6.1 | 1.8 | 1.5 |
| 4 Ounces | 7.5 | 5.8 | 2.2 | 2.5 |
| 6 Ounces | 9.4 | 6.2 | 3.1 | 3.7 |
| 8 Ounces | 15.0 | 7.5 | 5.0 | 6.1 |
| 10 Ounces | ------------- | 11.0 | 8.5 | 11.0 |
| 11 Ounces | ------------- | 18.0 | 10.5 | 17.0 |

As shown by Table 2 Bath I, prepared with ordinary tap water and containing no additive, etched at a rate which was slowed fairly markedly at the lower dissolved copper concentrations. Bath I also exhibited an undesirably high degree of peroxide decomposition. Bath J shows substantial improvement over Bath I. Bath K has high capacity and rapid etch rate at the higher dissolved copper concentrations even when using ordinary tap water and demonstrates the preference for using phenacetin and sulfathiazole in combination. Bath L shows that silver nitrate permits rapid high capacity etching with phenacetin. Etch rates and capacity of Bath L are substantially higher than those of the phenacetin containing Bath B prepared with deionized water even though precipitated silver halide material was permitted to remain in the etchant bath.

EXAMPLES 13–15

Employing the immersion etching procedure outlined above, three different etchant solutions were tested by etching a series of copper clad specimens in each solution. Each of the solutions tested (Baths M–O, inclusive) contained 8% by weight hydrogen peroxide. Bath M also contained about 17.5% by weight sulfuric acid, 400 parts per million phenacetin, 250 parts per million sulfathiazole, and 267 parts per million silver nitrate. Bath N also contained 22.3% by weight nitric acid, 400 parts per million phenacetin, and 250 parts per million sulfathiazole. Bath O also contained 31.3% by weight fluoboric acid, 400 parts per million phenacetin, and 267 parts per million silver nitrate. During etching each of the solutions was regulated at a temperature of 60° C. Results summarizing Examples 13–15 are given below in Table 3.

*Table 3*

| Concentration | Etch Rate, Minutes | | |
|---|---|---|---|
| | Bath M | Bath N | Bath O |
| | Peroxide, 400 p.p.m. Phenacetin, 250 p.p.m. Sulfathiazole, 267 p.p.m. Silver Nitrate | Peroxide, 400 p.p.m. Phenacetin, 250 p.p.m. Sulfathiazole | Peroxide, 400 p.p.m. Phenacetin, 267 p.p.m. Silver Nitrate |
| Ounces Copper Dissolved Per Gallon of Etchant: | | | |
| Initial Rate | 0.9 | 1.5 | 1.5 |
| 2 Ounces | 1.5 | 1.5 | 2.0 |
| 4 Ounces | 3.1 | 2.0 | 3.0 |
| 6 Ounces | 3.6 | 4.0 | 4.0 |
| 8 Ounces | 3.8 | 10.5 | 8.0 |
| 10 Ounces | 5.6 | ------------- | 15.0 |
| 11 Ounces | 8.0 | ------------- | 20.0 |

As shown by Table 3, Bath M containing sulfuric acid, phenacetin, and silver nitrate is a particularly preferred etchant solution of exceptionally high capacity, such that the etch rate at 11 ounces of dissolved copper is only a matter of about eight minutes. Bath N demonstrates that nitric acid may be employed in the etchant solution of the invention to improve etch rate and capacity. Bath O demonstrates that fluoboric acid is also useful in improving etch rate and capacity.

In the following examples the copper clad laminates were cut into board specimens having dimensions 9 x 9 x 1/16 inch. Each of these specimens was then sprayed etched using a Model 600 Spray Etcher manufactured by the Chemcut Division of Centre Circuits Company (U.S.A.). The reservoir of the spray etcher was charged with about 3 gallons of etchant solution and the spray etcher set to apply about 5 gallons per minute to each specimen. Etch time was determined with a stopwatch and etch rate calculated after weighing each specimen before and after treatment.

EXAMPLES 16–19

Four peroxide solutions were prepared for testing by the above outlined spray etching procedure. Each of the solutions contained about 6% hydrogen peroxide and 13% sulfuric acid such that the mol ratio of hydrogen peroxide to sulfuric acid was about 1 to 0.75. The Example 16 solution was prepared with ordinary tap water and contained at least about 5 parts per million total free chloride and bromide ion. The Example 17 solution also contained no additive but was prepared using deionized water such that it contained only about 0.2 part per million of chloride and bromide ion. The Example 18 solution was prepared from the same tap water used in Example 16 and contained about 400 parts per million of phenacetin and 400 parts per million of sulfathiazole. The Example 19 solution was prepared similar to that of Example 18 except that deionized water was employed such that the solution contained only about 0.2 part per million total free chloride and bromide ions. All solutions were regulated during spray etching at a temperature of about 60° C. Results summarizing Examples 16–19 are given in Table 4.

*Table 4*

| Concentration | Etch Rate, Minutes | | | |
|---|---|---|---|---|
| | Ex. 16 | Ex. 17 | Ex. 18 | Ex. 19 |
| | No Additive Tap Water | No Additive, Deionized Water | 400 p.p.m. Phenacetin, 400 p.p.m. Sulfathiazole, Tap Water | 400 p.p.m. Phenacetin, 400 p.p.m. Sulfathiazole, Deionized Water |
| Ounces Copper Dissolved Per Gallon of Etchant: | | | | |
| Initial Rate | 11 | 2.3 | 1.6 | 1.6 |
| 2 Ounces | 12.4 | 5.0 | 1.6 | 1.7 |
| 4 Ounces | 18.0 | 10.3 | 2.1 | 2.1 |
| 6 Ounces | ------------ | 30.0 | 3.0 | 3.0 |
| 8 Ounces | ------------ | ------------ | 5.0 | 5.0 |
| 10 Ounces | ------------ | ------------ | 14.0 | 14.0 |

As shown by Table 4, the peroxide solution of Example 16 containing no additive and prepared with ordinary tap water is unsuitable for practical use in spray etching with a high initial etch rate of 11 minutes and capacity less than 6 ounces of dissolved copper. Example 17 indicates improvement over the solutions of Example 16 is obtained in spray etching simply by reducing the total free chloride and bromide ion content below the 2 parts per million level. In Example 16 difficulty was encountered in pumping the solution through the spray etcher. Example 18 solution demonstrates that the addition of phenacetin and sulfathiazole produces an etchant having exceptionally high capacity and fast etch rates despite the use of tap water in make-up of the etchant. The etchant solution of Example 19 prepared with deionized water has essentially the same high capacity as the solution of Example 18 demonstrating that the etchants containing phenacetin and sulfathiazole are equally effective regardless of the presence of chloride and bromide as introduced during preparation.

EXAMPLES 20–22

Three additional spray etchants were prepared containing 6% hydrogen peroxide and 13% sulfuric acid. The Example 20 etchant solution contained 300 parts per million of phenacetin and was prepared using ordinary tap water such that the solution was contaminated with at least about 5 parts per million total chloride and bromide ion. The Example 21 etchant also contained 300 parts per million phenacetin but was prepared from deionized water such that it contained only 0.2 part per million total free chloride and bromide ion. The Example 22 solution was prepared from ordinary tap water and by addition of 300 parts per million phenacetin and 200 parts per million silver nitrate. All solutions were regulated during etching at a temperature of 60° C. Results summarizing Examples 20–22 are given in Table 5.

*Table 5*

| Concentration | Etch Rate, Minutes | | |
|---|---|---|---|
| | Ex. 20 | Ex. 21 | Ex. 22 |
| | 300 p.p.m. Phenacetin, Tap Water | 300 p.p.m. Phenacetin, Deionized Water | 300 p.p.m. Phenacetin, 200 p.p.m. Silver Nitrate |
| Ounces Copper Dissolved Per Gallon of Etchant: | | | |
| Initial Rate | 14.5 | 1.7 | 1.8 |
| 2 Ounces | 10.5 | 2.6 | 2.0 |
| 4 Ounces | 9.0 | 4.8 | 2.5 |
| 6 Ounces | 15.0 | 10.0 | 3.5 |
| 7 Ounces | ------------ | 16.0 | 4.4 |
| 8 Ounces | ------------ | ------------ | 6.3 |
| 9 Ounces | ------------ | ------------ | 20.0 |

Example 20 of Table 5 shows results obtained with acidified-hydrogen peroxide solution containing phenacetin and also contaminating amounts of chloride and bromide ions. Examples 21 and 22 demonstrates that the phenacetin alone provides an exceptionally good spray etchant of high capacity when the chloride and bromide ion concentration is reduced to below 2 p.p.m. A comparison of the Example 21 and 22 solutions shows that the Example 22 solution containing silver nitrate is more effective than the Example 21 solution even in the presence of precipitated silver halide matter in the etchant.

EXAMPLES 23–36

Additional spray etching tests were conducted to determine the influence of acid concentration on the copper etch rate. The etchant solutions employed contained initially 6% hydrogen peroxide and had a concentration of sulfuric acid between about 2–8%. All solutions were prepared with deionized water and had a total free chloride and bromide ion concentration of only about 0.2 part per million. All solutions contained 400 p.p.m. of phenacetin. To some of the partially exhausted solutions varying small amounts of additional acid were added as required to give a specific acid concentration at a particular dissolved copper concentration. All specimens were etched at a solution temperature of 60° C. Results are summarized below in Table 6.

*Table 6*

| Example No. | Amount of dissolved Copper, Ounces | Acid Concentration, Percent | Etch Time, Minutes |
|---|---|---|---|
| 23–25 | No Dissolved Copper | 2–4<br>4–6<br>6–8 | 1.7<br>1.7<br>1.9 |
| 26–29 | 2 Ounces | 2–4<br>4–6<br>6–8 | 2.0<br>1.9<br>3.0 |
| 30–33 | 4 Ounces | 2–4<br>4–6<br>6–8 | 3.5<br>3.0<br>5.4 |
| 34–36 | 6 Ounces | 2–4<br>4–6<br>6–8 | 9.0<br>6.8<br>11.8 |

Table 6 shows that acid concentration can have interesting and unexpected influence on the peroxide etch rate. As indicated particularly by Examples 23–25 the etch rate is relatively independent of the acid concentration in the solutions containing little or no dissolved copper. As the copper ion concentration increases the acid concentration becomes progressively more important. As shown by Examples 34–36, the higher acid concentrations retard the etch rate as greater amounts of copper accumulate in the etchant. Similarly, the etch rate is slowed at the lower acid concentrations less than about 2 or 3% as the dissolved copper concentration increases. Examples 26–33 indicated that the adverse effect of a low acid concentration is not as great as that of a high concentration for a given amount of dissolved copper. Analysis of Table 6 also shows unexpectedly that the etch rate is at a maximum for all the indicated copper concentrations when the acid concentration is within an optimum range of about 4–6%.

The present invention is eminently suited for etching of copper in a highly efficient and practical manner and substantially reduces the cost of etching in the manufacture of printed circuit boards as heretofore carried out with ammonium persulfate. In addition to etching of copper the invention may be applied generally in other conventional chemical dissolving operations such as chemical milling, graining and bright dipping or polishing. In such applications the temperature of the acid-peroxide solution may be varied, if desired, outside of the range prescribed for the etching of copper. For example, bright dipping operations may be carried effectively at room temperature or slightly above. The addition of phenacetin or sulfathiazole to acid-peroxide solutions is beneficially effective not only in the presence of copper but also other metal ions. Thus, the acid solutions containing the phenacetin and sulfathiazole may be employed in the dissolution of other metals such as iron, nickel, cadmium, zinc, germanium, lead, steel, aluminum and alloys containing a major portion of such metals. Aluminum metal is more effectively dissolved when the acid employed is nitric acid or fluoboric acid, particularly fluoboric acid. The solutions are, however, less effective on certain other metals such as gold, tin, chromium, stainless steel and titanium.

Although certain preferred embodiments of the invention have been disclosed for purpose of illustration, it will be evident that various changes and modifications may be made therein without departing from the scope and spirit of the invention.

We claim:

1. The method for dissolution of metal which comprises contacting the metal selected from the group consisting of copper and alloys thereof with an aqueous solution containing 2–12% by weight hydrogen peroxide, about 0.45–

5.5 grams per liter hydrogen ion; and having incorporated therein a catalytic amount of an additive selected from the group consisting of phenacetin, sulfathiazole, silver ions, and mixtures thereof.

2. The method of claim 1 in which the solution has a total free chloride and bromide ion content less than 2 parts per million.

3. The method of claim 1 in which the solution has incorporated therein between about 100 to 1,000 parts per million phenacetin and between about 100 to 1,000 parts per million sulfathiazole.

4. The method of claim 1 in which the additive is a mixture of sulfathiazole and silver ions.

5. The method of claim 1 in which the solution has incorporated therein between about 100–1,000 parts per million phenacetin and between about 50–500 parts per million silver ions.

6. The method for dissolution of metal selected from the group consisting of copper and alloys thereof which comprises contacting the metal with an aqueous solution containing 2–12% by weight hydrogen peroxide, about 2–23% by weight sulfuric acid, and a catalytic amount of phenacetin.

7. The method of claim 6 in which the solution contains between about 200–1,000 parts per million phenacetin.

8. The method for dissolution of metal selected from the group consisting of copper and alloys thereof which comprises contacting the metal with an aqueous solution containing 2–12% by weight hydrogen peroxide, about 2–23% by weight sulfuric acid, and a catalytic amount of sulfathiazole.

9. The method of claim 7 in which the solution contains about 200–1,000 parts per million sulfathiazole.

10. The method for dissolution of metal selected from the group consisting of copper and alloys thereof which comprises contacting the metal with an aqueous solution containing 2–12% by weight hydrogen peroxide, about 2–23% by weight sulfuric acid, and a catalytic amount of silver ions.

11. A composition for metal dissolution comprising an aqueous solution of 4–12% by weight hydrogen peroxide. about 0.45–5.5 grams per liter hydrogen ion and having incorporated therein a catalytic amount of additive selected from the group consisting of phenacetin, sulfathiazole, silver ions, and mixtures thereof.

12. The composition of claim 11 in which the solution has a total free chloride and bromide ion concentration less than about 2 parts per million.

13. The composition of claim 11 in which the additive is a mixture of phenacetin and silver ions.

14. The composition of claim 11 having incorporated therein between about 100–1,000 parts per million phenacetin and between about 100–1,000 parts per million sulfathiazole.

15. The composition of claim 11 having incorporated therein between about 100–1,000 parts per million phenacetin and between about 50–500 parts per million silver ions.

16. A composition for metal dissolution comprising an aqueous solution of 4–12% by weight hydrogen peroxide, about 2–23% by weight sulfuric acid and having incorporated therein a catalytic amount of phenacetin.

17. A composition for metal dissolution comprising an aqueous solution of 4–12% by weight hydrogen peroxide, about 2–23% by weight sulfuric acid and having incorporated therein a catalytic amount of sulfathiazole.

18. A composition for metal dissolution comprising an aqueous solution of 4–12% by weight hydrogen peroxide, about 2–23% by weight sulfuric acid and having incorporated therein a catalytic amount of silver ions.

(References on following page)

References Cited by the Examiner

UNITED STATES PATENTS

| | | | |
|---|---|---|---|
| 2,154,451 | 4/1939 | Hull | 252—79.2 |
| 2,154,455 | 4/1939 | Kepfer | 252—79.2 |
| 2,318,559 | 5/1943 | Percival | 148—8 |
| 2,491,490 | 12/1949 | Folsome | 252—99X |
| 2,719,781 | 10/1955 | Hesch | 252—79.3 X |
| 2,758,074 | 8/1956 | Black | 156—18 X |
| 2,860,039 | 11/1958 | Margulies et al. | 156—18 |
| 2,923,608 | 2/1960 | Margulies | 156—18 |
| 3,033,725 | 5/1962 | Daugherty et al. | 156—14 |

JACOB H. STEINBERG, *Primary Examiner.*

ALEXANDER WYMAN, *Examiner.*